United States Patent [19]
Chiang et al.

[11] Patent Number: 6,069,088
[45] Date of Patent: May 30, 2000

[54] METHOD FOR PROLONGING LIFE TIME OF A PLASMA ETCHING CHAMBER

[75] Inventors: Wen-Peng Chiang; Wen-Pin Hsieh, both of Hsin-Chu, Taiwan

[73] Assignee: Mosel Vitelic Incorporated, Hsin-Chu, Taiwan

[21] Appl. No.: 09/265,975

[22] Filed: Mar. 11, 1999

[30] Foreign Application Priority Data

Jan. 11, 1999 [TW] Taiwan .................................. 88100299

[51] Int. Cl.$^7$ ..................................... H01L 21/00
[52] U.S. Cl. .......................... 438/706; 438/707; 438/710; 438/712; 438/729; 156/345
[58] Field of Search ..................... 438/706, 710, 438/712, 707, 729, 730; 156/345

[56] References Cited

U.S. PATENT DOCUMENTS

| | | | |
|---|---|---|---|
| 4,786,352 | 11/1988 | Benzing .................................. | 153/345 |
| 5,346,578 | 9/1994 | Benzing et al. ......................... | 156/345 |
| 5,646,489 | 7/1997 | Kakehi et al. ...................... | 315/111.21 |
| 5,685,941 | 11/1997 | Forster et al. .......................... | 156/345 |

*Primary Examiner*—Benjamin L. Utech
*Assistant Examiner*—Binh Tran
*Attorney, Agent, or Firm*—Bacon & Thomas

[57] ABSTRACT

The present invention relates to a method for prolonging life time of a dry etching chamber. A neck portion of the dry etching chamber, according to the present invention, is divided three sections, namely a first section, a second section and a third section in sequence from top of the neck portion to bottom thereof and each section has the same area. A first phase of a two-phase connection method, according to the present invention, then proceeds as the following. The first section is surrounded by an electrode coil connected to a rf power and the second section is surrounded by an electrode coil connected to the ground, not touching the electrode coil connected to the rf power, so that a plasma field within the dry etching chamber can be produced to perform a dry etching. The dry etching can be applied in production line until before life time of the first section comes to an end, i.e. about 95 % of life time of the dry etching chamber disclosed in prior art. After that, a second phase of the two-phase connection method, according to the present invention, proceeds as the following The second section is surrounded by the electrode coil connected to the rf power and the third section is surrounded by the electrode coil connected to the ground but not touching the electrode coil connected to the rf power, thereby performing another dry etching until life time of the second section comes to an end. Thus, life time of the dry etching chamber, according to the present invention, can be prolonged about one time compared with that of prior art.

3 Claims, 2 Drawing Sheets

6,069,088

1

METHOD FOR PROLONGING LIFE TIME OF A PLASMA ETCHING CHAMBER

DESCRIPTION OF THE PRIOR ART

Semiconductor devices are fabricated step-by-step, beginning with a silicon wafer (substrate), implanting various ions, depositing insulating and conductive layers. Some of these layers are subsequently etched by using a patterned photoresist as a mask to create various circuit structures; wherein these pattern transferring processes substantially include a photolithography process, transferring a pattern of a mask to a photoresist layer overlying the silicon wafer, and then a dry etching process, transferring a pattern of the photoresist layer to these insulating or conductive layers by selectively removing unmasked area thereof. In early days of semiconductor devices, their line width are about 5–7 micrometer due to their low integration density and they can be realized by a chemical etching (i.e. wet etching) to remove portion of layers that is unmasked by the photoresist. Although lateral etching will occur and result in a toss of line width and narrowed lines during the chemical etching, a ration of the loss to original line width (i.e. 5–7 micrometer) is so small to be neglected; in other words, the resultant line width after removing the photoresist are about the same size as original designed value. However, when line width becomes more narrow to meet a need for higher integration density, for example 1 micrometer for Very Large Scale Integration (VLSI), the ration of the loss to original line width is large and hence a distortion of line width is such serious that the chemical etching can not be applied. In order to resolve said problem, a plasma etching (i.e. dry etching) is proposed, which is substantial a cloud of ions and produced between two plate electrodes, one connected to a rf power and the other connected to the ground. Meanwhile, ion sheath is also produced near these two plate electrodes, wherein a voltage drop crossing the ion sheath of the plate electrode connected to the rf power is much larger than that of the plate electrode connected to the ground. Therefore, most of ions are accelerated by the voltage drop crossing the ion sheath of plate electrode connected to the rf power and bombard a wafer thereon, thereby etching partial portion of a layer overlying the silicon wafer where is not protected by a photoresist, which is so called "plasma etching", just like a sputtering mechanism. Since direction of bombarding is along electric field, lateral etching will not occur during plasma etching and this called "anisotropic etching". Hence, a plasma etching can produce almost no distortion of pattern because of no lateral etching, and thus it is widely employed in VLSI to meet a need for high integration density.

Now in production line, a connection method between rf power and a plasma etching chamber such as TEL instrument is shown in FIG. 1, wherein the plasma etching chamber likes a bell jar amd comprises a neck portion 1, surrounded by one electrode coil connected to the rf power on its upper portion and by the other electrode coil connected to the ground on its lower portion, and a half spherical portion 2 where a plasma can be produced inside. As to other accessory equipments such as rf power source, resistance matcher circuit, etc., they are not shown in FIG. 1 because they have nothing to do with key points of the present invention. Since material of the plasma etching chamber is quartz, the neck wall is also etched while a plasma etching proceeds, especially at a region where is surrounded by the rf power becuase of its ion sheath having higher voltage drop as aforesaid. After a series of experiments and a statistical analysis, if the plasma etching chamber undertakes a plasma etching continuously, its life time is about 25–27 hours. Besides, the plasma etching chamber is expensive so it is inevitable to increase much running cost as well as fabrication cost. Therefore, how to reduce fabrication cost resulting from the plasma etching chamber's expense is a key issue for semiconductor producers.

SUMMARY OF INVENTION

Therefore, an object of the invention is to provide a method for prolonging life time of a plasma etching chamber and considerably reducing its expense.

It is another object of the invention to provide a method for prolonging life time of a plasma etching chamber and considerably reducing its running cost as well as fabrication cost of devices.

A neck portion of the dry etching chamber, according to the present invention, is divided three sections, namely a first section, a second section and a third section in sequence from top of the neck portion to bottom thereof and each section has the same area. A first phase of a two-phase connection method, according to the present invention then proceeds as follows. The first section is surrounded by an electrode coil connected to a rf power and the second section is surrounded by an electrode coil connected to the ground, not touching the electrode coil connected to the rf power, so that a plasma field within the dry etching chamber can be produced to perform a dry etching. The dry etching can be applied in production line until before life time of the first section comes to an end, i.e. about 95% of life time of the dry etching chamber disclosed in prior art. After that, a second phase of the two-phase connection method, according to the present invention, proceeds as follows The second section is surrounded by the electrode coil connected to the rf power and the third section is surrounded by the electrode coil connected to the ground but not touching the electrode coil connected to the rf power, thereby performing another dry etching until life time of the second section comes to an end. Thus, life time of the dry etching chamber, according to the present invention, can be prolonged about one time compared with that of prior art.

BRIEF DESCRIPTION OF THE DRAWINGS

The invention itself, however, as well as other features and advantages thereof, will be best understood by reference to the detailed description which follows, read in conjunction with the accompanying drawings, wherein.

DESCRIPTION OF THE PREFERRED EMBODIMENT

As aforementioned, a neck portion is also etched while a plasma etching proceeds especially at a region where is surrounded by an electrode coil connected to a rf power. If we can take full advantage of whole neck portion 1 of the plasma etching chamber before it is used up, its life time should be prolonged. Therefore, we propose a two-phase connection method between the rf power and the neck portion 1 and then makes statistical etching rate and uniformity datas of sample wafers, which can be compared to those of prior art to insure that yield and etching quality resulting from this method is feasible. Since the region of the neck portion I surrounded by the electrode coil connected to the rf power is etched faster than that surrounded by the electrode coil connected to the ground, the neck portion 1 is divided three sections, namely a first section, a second section and a third section in sequence from top of the neck portion 1 to bottom thereof and each section has the same area. Then, the first phase of the two-phase connection method proceeds as the following. The first section A is surrounded by an electrode coil connected to a rf power, while the second section B is surrounded by an electrode coil connected to the ground, wherein these two electrode coils should not be touched in order to avoid a short circuit therebetween and spaced preferably 5 mm long, as shown in FIG. 2(A).

A plasma field can be produced to perform a dry etching within the half spherical portion 2 where wafers is placed to be etched, This dry etching can be applied in production line until before life time of the first section A comes to an end, i.e. about (95% of life time of the dry etching chamber disclosed in prior art, but it isn't used up otherwise the whole neck portion 1 can't be used. After that, we uses the second phase of the two-phase connection method, as shown in FIG. 2(B); i.e. the second section B is surrounded by the electrode coil connected to the rf power, while the third section C is surrounded by the electrode coil connected to the ground, wherein these two electrode coils also are not touched in order to avoid a short circuit therebetween. Thus, another dry etching proceeds until life time of the second section B comes to an end. Since the two-phase connection method can perform two phase dry etching, the whole neck portion 1 is fully taken advantage so that life time of the plasma etching chamber is naturally prolonged about one time that of prior art.

Figure 1:
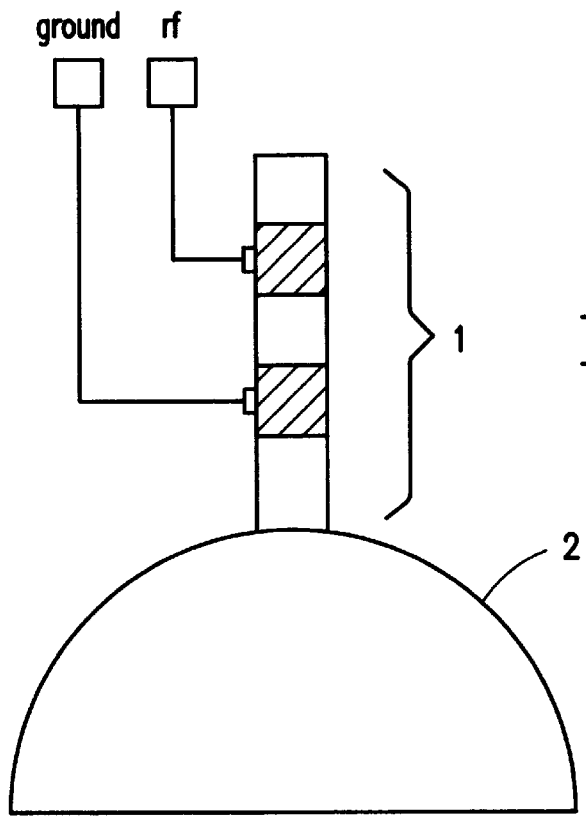
FIG. 1 illustrates a connection method between a rf power and a plasma etching chamber disclosed in prior art.

Generally speaking thickness of chamber wall is 5 mm and in order to insure that yield and etching quality resulting from said two-phase connection method is feasible, we make statistical datas wherein etching rate and uniformity are most important to be verified, Supposed that the central point of the silicon wafer is to be set the original point of coordinates, we take five measurement points along the X-axis, each space between neighbouring points being equidistant, as well as along Y-axis, Since the original point is central point of five points along X-axis, as well as along Y axis, the total measurement points of the silicon wafer are 9, Subsequently, 9 sets of etching rate at these 9 measurement points can be calculated by thickness reduction at a given time interval, and then a mean etching rate of the silicon wafer can be found by 9 dividing a whole summation of all etching rates, An uniformity of the silicon wafer is defined as a difference of the maximum etching rate and the minimum is divided by the mean etching rate and then multiplied by 100%. According said definitions, the resultant data of the first phase connection method, shown in FIG. 2(A), are listed as following: the mean etching rate and the uniformity being 2894 (angstrom per minute) and 8.37% respectively, The resultant data of the second phase connection method, shown in FIG. 2(B), are listed as following: the mean etching rate and the uniformity being 2596 (angstrom per minute) and 7.4% respectively. The resultant data of prior art, shown in FIG. 1, are listed as following: the mean etching rate and the uniformity being 2537 (angstrom per minute) and 5.89 respectively Therefore, by comparing said these datas, we obviously find that the resultant datas of the two-phase connection method are much close to that of prior art, which indicates that the etching quality of the former doesn't worsen, Thus, the two-phase connection method is verified to be feasible by above analyses.

Figure 2:
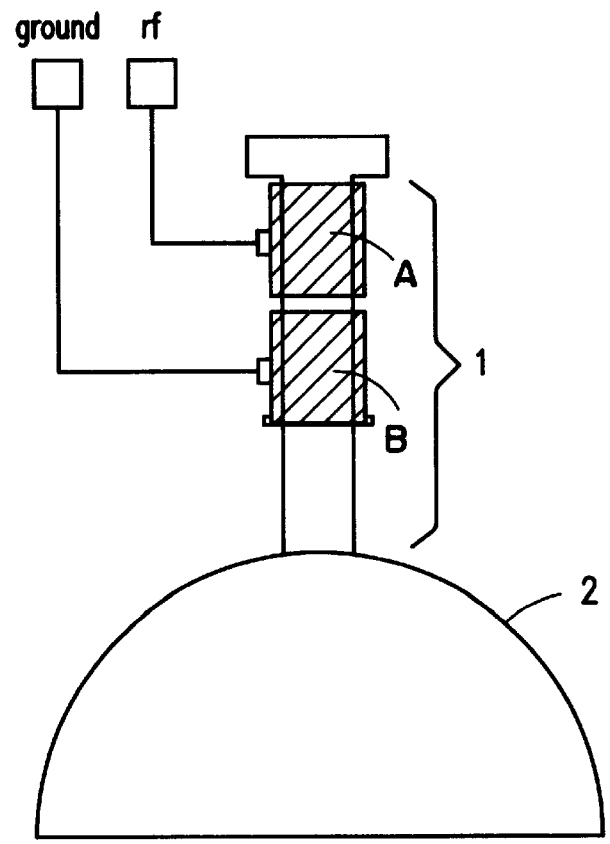
FIG. 2(A) and 2 (B) illustrate a connection method between a rf power and a plasma etching chamber, according to the present invention.
Figure 2B:
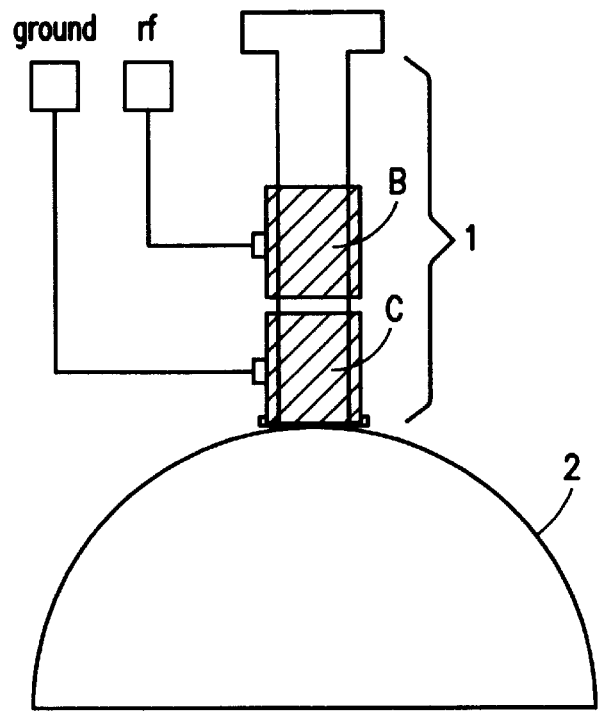
Figure 3A:
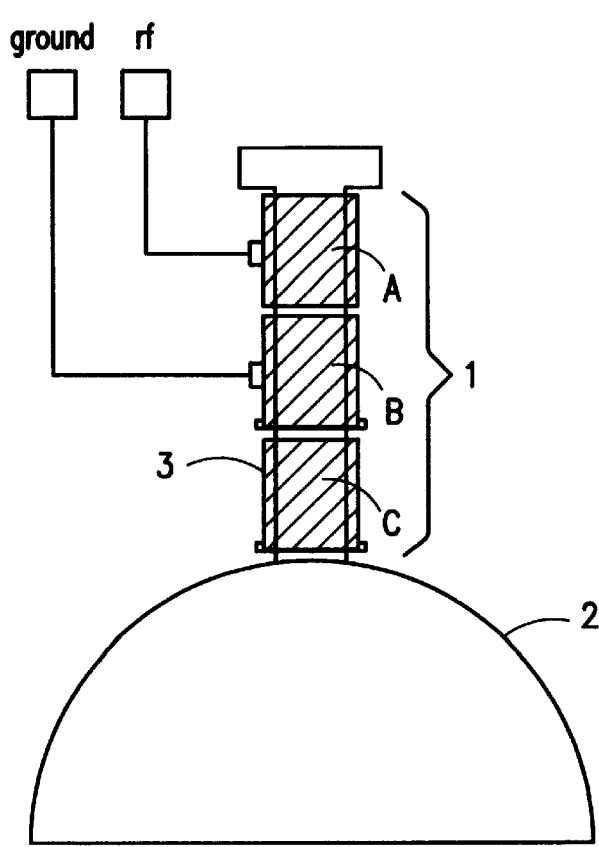
FIG. 3(A) is a diagram showing an assembly of FIG. 2(A) and an auxiliary device, according to the present invention.
Figure 3B:
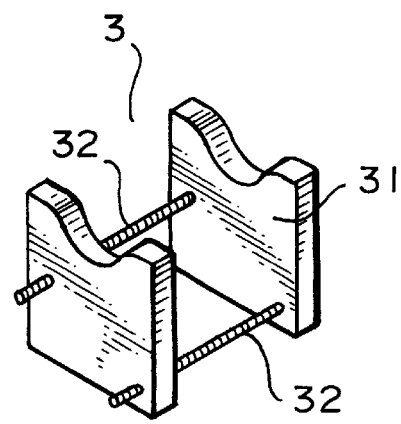
FIG. 3(B) illustrates components of an auxiliary device, according to the present invention.

Since there is more or less slide of positioning the elctrode coils of the first phase connection method, shown in FIG. 2(A), the neck portion 1 can't be fully taken advantage to prolong its life time to a maximum value. In order to overcome this problem, an auxiliary device of a blocking clip 3 is placed under the electrode coil connected to the ground, as shown in FIG. 3(A), to prevent the electrode coils from sliding. The blocking clip 3 substantially comprises two blocking sheets 31, their height being equal to length of the third section C, and a plurality of screws 32 combining these two blocking sheets 31, as shown in FIG. 3(B). Material of these two blocking sheets prefers to be teflon. By screwing screws 32, these two blocking sheets 32 can pinch the neck portion 1 to prevent the electrode coils from sliding. Thus, the whole neck portion 1 can be fully taken advantage to prolong its life time to a maximum value.

While particular embodiment of the present invention has been illustrated and described, it would be obvious to those skilled in the art that various other changes and modifications can be made with departing from the spirit and scope of the invention. It is therefore intended to cover in the appened claim all such changes and modifications that are within the scope of the present invention.

What is claimed is:

1. A method for prolonging life time of a plasma etching chamber comprising the steps of:

dividing a neck portion of the plasma etching chamber into three sections, namely a first section, a second section and a third section in sequence from top of the neck portion to bottom thereof and each section having the same area;

a first phase of a two-phase connection method then proceeding as following: the first section being surrounded by an electrode coil connected to a rf power, and the second section being surrounded by an electrode coil connected to the ground, wherein these two electrode coils do not touched in order to avoid a short circuit;

performing a dry etching by producing a plasma field inside a half spherical portion where wafers is placed to be etched;

applying the dry etching in production line until before life time of the first section comes to an end;

Subsequently, a second phase of the two-phase connection method proceeding as following: the second section being surrounded by the electrode coil connected to the rf power and the third section being surrounded by the electrode coil connected to the ground, wherein these two electrode coils do not touch;

performing another dry etching by producing a plasma field inside the half spherical portion where wafers is placed to be etched;

applying said another dry etching in production line until life time of the second section comes to an end; and thus life time of the plasma etching chamber being prolonged by the two-phase connection method.

2. The method of claim 1, wherein when the first phase of the two-phase connection method proceeds, an auxiliary device of a blocking clip is placed under the electrode coil connected to the ground to prevent the electrode coils from sliding.

3. The method of claim 2, wherein the blocking clip substantially comprises two blocking sheets, their height being equal to length of the third section, and a plurality of screws combining these two blocking sheets, thereby these two blocking sheets pinching the neck wall by screwing these screws to prevent the electrode coils from sliding.

* * * * *